United States Patent
Wahler

(10) Patent No.: US 9,629,270 B2
(45) Date of Patent: Apr. 18, 2017

(54) VEHICLE DATA RECORDING UNIT FOR INSTALLATION IN A MOTOR VEHICLE

(71) Applicant: Torsten Wahler, Bad Dürrheim (DE)

(72) Inventor: Torsten Wahler, Bad Dürrheim (DE)

(73) Assignee: Continental Automotive GmbH, Hannover (DE)

( * ) Notice: Subject to any disclaimer, the term of this patent is extended or adjusted under 35 U.S.C. 154(b) by 76 days.

(21) Appl. No.: 13/935,061

(22) Filed: Jul. 3, 2013

(65) Prior Publication Data
US 2014/0016251 A1    Jan. 16, 2014

(30) Foreign Application Priority Data

Jul. 6, 2012    (DE) .................. 10 2012 013 317

(51) Int. Cl.
*H01M 2/10*    (2006.01)
*H05K 5/02*    (2006.01)

(52) U.S. Cl.
CPC ........ *H05K 5/0286* (2013.01); *H01M 2/1083* (2013.01)

(58) Field of Classification Search
None
See application file for complete search history.

(56) References Cited

U.S. PATENT DOCUMENTS

| | | | | |
|---|---|---|---|---|
| 4,205,121 A * | 5/1980 | Naitoh | ............... | H01M 2/1022 429/176 |
| 4,431,717 A * | 2/1984 | Kikuchi | ............. | H01M 2/1055 429/100 |
| 4,853,302 A * | 8/1989 | Yamanaka | .......... | H01M 2/1022 429/100 |
| 4,863,812 A | 9/1989 | Ueda et al. | | |
| 7,859,220 B2 * | 12/2010 | Bushong | ............... | H02J 7/0045 320/107 |
| 7,884,573 B1 * | 2/2011 | Larsen | .......................... | 320/110 |
| 2004/0033718 A1 * | 2/2004 | Suzuki | ......................... | 439/500 |
| 2005/0026035 A1 * | 2/2005 | Ishikawa | ............. | H01M 2/1027 429/100 |
| 2005/0264258 A1 * | 12/2005 | Yeh | .............................. | 320/112 |
| 2009/0040752 A1 | 2/2009 | Dallas | | |

FOREIGN PATENT DOCUMENTS

| | | |
|---|---|---|
| DE | 37 90 276 T1 | 6/1988 |
| DE | 10 2008 061 717 | 12/2008 |
| DE | 10 2008 061 717 A1 | 6/2010 |

* cited by examiner

*Primary Examiner* — Patrick Ryan
*Assistant Examiner* — Wyatt McConnell
(74) *Attorney, Agent, or Firm* — Cozen O'Connor

(57) ABSTRACT

A vehicle data recording unit for installation in a motor vehicle having a housing. Within the housing is an electronic memory and control unit and a battery receptacle for receiving a buffer battery for the memory and control unit. The battery receptacle has a battery compartment delimited by a first stop and a second stop, situated opposite the first stop, for holding a first buffer battery between the first stop and the second stop. To make it easy to use buffer batteries of different physical sizes, a third stop is arranged between the first stop and the second stop, which has a smaller length than the first buffer battery, in the battery compartment between the third stop and the first stop, such that optionally the first buffer battery or the second buffer battery can be held in the battery compartment.

9 Claims, 3 Drawing Sheets

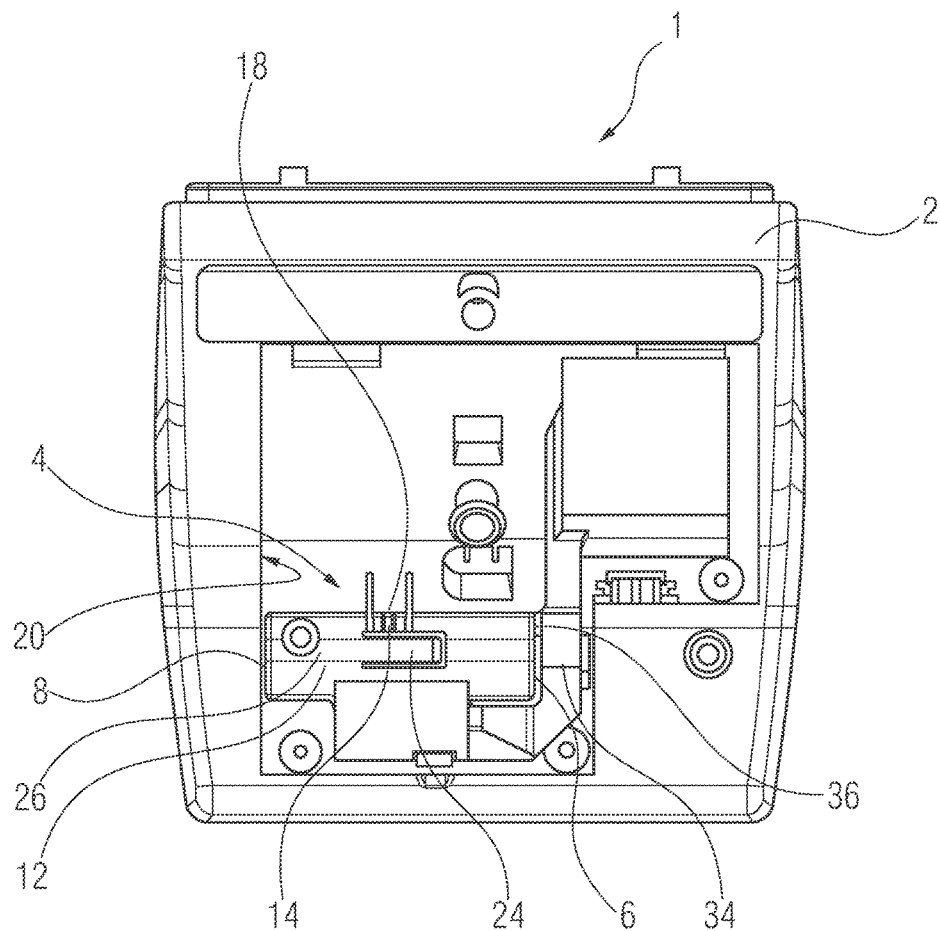
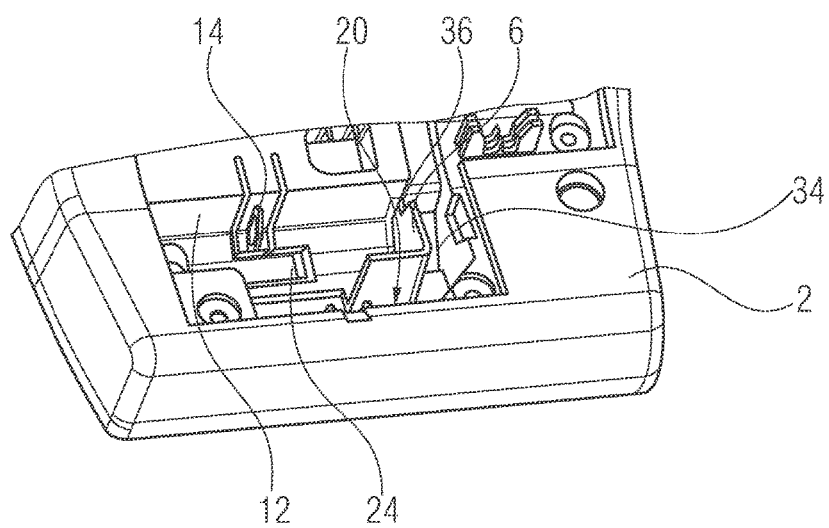

VEHICLE DATA RECORDING UNIT FOR INSTALLATION IN A MOTOR VEHICLE

BACKGROUND OF THE INVENTION

1. Field of the Invention

The invention relates to a vehicle data recording unit for installation in a motor vehicle, in particular a tachograph, having a housing. Within the housing, an electronic memory, a control unit, and a battery receptacle for receiving a buffer battery for the memory and control unit are arranged. The battery receptacle has a battery compartment delimited by a first stop and a second stop, the second stop situated opposite the first stop, for holding a first buffer battery between the first stop and the second stop.

2. Description of the Related Art

DE 10 2008 061 717 A1 discloses a tachograph device for a motor vehicle having a circuit of an electronic memory and control unit arranged on a printed circuit board, which has voltage applied thereto by a buffer battery, and having a housing in which the printed circuit board and a pot-shaped battery receptacle are fixedly arranged. The buffer battery can be inserted into the battery receptacle through a fitting opening of the battery receptacle, and can be connected in an electrically conductive fashion by a plug contact to a counterpart plug contact of the printed circuit board. The size of the battery receptacle is coordinated with the size of a buffer battery that can be used.

SUMMARY OF THE INVENTION

It is an object of one embodiment of the invention to provide a vehicle data recording unit of the type specified in the introduction that can use buffer batteries of different physical size.

According to one embodiment of the invention, between the first stop and the second stop of the battery receptacle, there is arranged a third stop of the battery receptacle for holding a second buffer battery, which has a smaller length than the first buffer battery, in the battery compartment between the third stop and the first stop, such that the first buffer battery or the second buffer battery can be held in the battery compartment.

A particular advantage of one embodiment of the invention is that, despite only one battery compartment being provided, it is nevertheless optionally possible, in a space-saving manner, for buffer batteries of different dimensions to be securely held. The buffer battery of the vehicle data recording unit permits constant availability of the vehicle data recording unit and/or of the data stored therein, such as for example journey data pertaining to a driver of the motor vehicle, even if an external power supply of the vehicle data recording unit is deactivated, for example when a vehicle ignition is switched off.

Since the buffer battery has only a limited service life, it must be exchanged at regular time intervals. Here, a user of the vehicle data recording unit according to the invention can select in a simple manner whether to use a buffer battery of relatively large storage capacity with a relatively long service life, or a buffer battery of relatively small storage capacity with a relatively short service life. The dimensions of a buffer battery with a relatively large storage capacity are generally greater than the dimensions of an otherwise similar buffer battery with smaller storage capacity.

To ensure that the buffer battery is held in the battery receptacle in a permanently reliable manner, in particular even in the event of vibrations that occur during driving operation of the motor vehicle, the first stop and/or the second stop is preferably of resiliently elastic form. It is also preferable here for the first stop and/or the second stop to be formed so as to be resiliently elastic in the direction of the longitudinal extent of the buffer battery.

The buffer batteries held in the battery receptacle are preferably cylindrical batteries. The shape of the first buffer battery has a greater cylinder height, which corresponds to the length of the buffer battery, than the shape of the second buffer battery. It is however also conceivable, for example, for the buffer batteries to be held in the battery receptacle to be cuboidal. The third stop is preferably arranged centrally between the first stop and the second stop, such that the second buffer battery may have a length half that of the first buffer battery.

In one embodiment of the invention, it is advantageously also not necessary to provide different variants of battery receptacles for holding buffer batteries of different size. Tooling costs and production costs for the vehicle data recording unit are thus reduced, and the manufacturing process is made simpler. Furthermore, no additional installation parts are required for adaptation to the size of the buffer battery. Here, in the vehicle data recording unit according to one embodiment of the invention, highly secure, vibration-insensitive mounting of the selected relatively large or relatively small buffer battery is nevertheless ensured.

It is conceivable for the third stop to be formed for example as a shoulder in the battery compartment, in particular as a shoulder in a base of the battery compartment. However, the battery receptacle in the housing takes up only a particularly small amount of installation space if, according to one advantageous refinement of the invention, the third stop is a resiliently elastic stop that projects into the battery compartment, the third stop can be pushed out of the battery compartment counter to its spring force. The third stop is thus arranged movably in the battery receptacle. If a relatively long buffer battery is installed, the third stop can be pushed away, specifically pivoted away (for example into a rear region, which faces toward the interior of the housing, of the battery receptacle), by the buffer battery. The third stop may preferably have a leaf spring element by which it is fastened to the battery receptacle. Furthermore, the third stop may preferably be designed to be resiliently elastic in the direction of the longitudinal extent of the buffer battery, such that a relatively short buffer battery, which is held by the first stop and the third stop is held, in particular clamped, in a secure and stable manner in the battery compartment.

It would basically be possible for the battery receptacle to be arranged within the housing such that the battery compartment of the battery receptacle is accessible only in the event of the housing being fully opened, for example disassembled. However, in particular for easy, simple, and fast exchange of the buffer battery, it is significantly advantageous if, corresponding to one refinement of the invention, the battery compartment is accessible from outside the housing through a housing opening of the housing, wherein the housing opening can be closed by a housing cover that forms a part of the housing.

In one advantageous refinement of the invention, the battery receptacle has, between the first stop and the second stop and on a side of the battery compartment facing away from the housing opening, a spring element. A spring direction of the spring element points towards the housing opening. That side of the battery compartment, which faces away from the housing opening is a side of the battery compartment, in particular a base of the battery compartment. The base is situated opposite a housing cover that is inserted into the housing opening and closes the housing opening. The spring element thus presses a buffer battery, which is arranged in the battery compartment, against the housing cover. In this way, the buffer battery is held without play in the battery receptacle, and rattling of the buffer battery in the battery receptacle does not occur, even in the event of vibrations of the housing.

The design of the battery receptacle is advantageously simplified, and the manufacture of the vehicle data recording unit is simplified, if, according to one refinement of the invention, the spring element is a spring tongue connected, so as to form a single component, to a wall of the battery compartment.

It is also particularly advantageous if, according to one refinement of the invention, the housing cover has a supporting lug that projects into the battery compartment. A buffer battery arranged in the battery compartment can be supported in a rattle-free manner in the battery compartment in a simple manner by the supporting lug. It is preferably possible for both the abovementioned spring element and also the supporting lug to be provided in the vehicle data recording unit according to one embodiment of the invention. It is particularly advantageous for the supporting lug to correspond to the third stop and, supplementing the third stop, to additionally hold a shorter buffer battery placed into the battery compartment. A buffer battery of relatively short length (referred to above as second buffer battery) is then held between the first stop on the one hand and the third stop together with the supporting lug of the housing cover on the other hand.

It would basically be possible for the buffer battery to be electrically contacted by metal spring tongues in the vehicle data recording unit. For particularly reliable contacting, however, it is advantageous for the buffer battery to have connecting cables for the memory and control unit, which connecting cables are connected to a plug or a plug receptacle for a plug connection. The connecting cables may advantageously be formed as plug cables and thus have the plug or the plug receptacle. The buffer battery is electrically connected to the vehicle data recording unit by the plug connection. The counterpart to the plug or to the plug receptacle of the buffer battery, that is to say the corresponding plug receptacle or corresponding plug, respectively, of the vehicle data recording unit is electrically connected to the memory and control unit. In one advantageous refinement of the invention, the battery receptacle has a plug chamber for a plug for the electrical contacting of the buffer battery held in the battery compartment, wherein the plug chamber is separated from the battery compartment by the first stop or by the second stop. In this way, the plug connection can be arranged in the housing securely and so as to be free from mechanical load.

In one advantageous refinement of the invention, the first stop or second stop, which separates the plug chamber from the battery compartment, has a recess for the leadthrough of a plug cable of the buffer battery. The plug cable—or if appropriate the plug cables—of the buffer battery can be reliably supported by the recess but led into the plug chamber for without the risk of pinching of the plug cable or of the plug cables. The recess is formed on the stop preferably in an open configuration, for example in a U-shape, though may in principle also be formed in the stop in a closed configuration, for example in an O-shape.

The battery receptacle can be produced in a particularly inexpensive, simple, and fast manner, in particular in the case of mass production, if, according to one advantageous refinement of the invention, the battery receptacle is formed as a single-piece injection-molded plastic component together with the first stop, the second stop, the third stop, the spring element, and the plug chamber.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment of the invention is illustrated in the drawing and will be described in more detail below. In the drawing:

FIG. 1 is a vehicle data recording unit in a view from below;

FIG. 2 is a detail of the vehicle data recording unit as per FIG. 1 in a perspective view;

Corresponding elements are denoted by the same reference signs in all of the figures.

DETAILED DESCRIPTION OF THE PRESENTLY PREFERRED EMBODIMENTS

FIG. 1 shows a vehicle data recording unit 1 for installation in a motor vehicle. The vehicle data recording unit 1 may for be a tachograph. The vehicle data recording unit 1 has a housing 2. An electronic memory and control unit concealed by housing parts in this view, is arranged within the housing 2.

Figure 3:
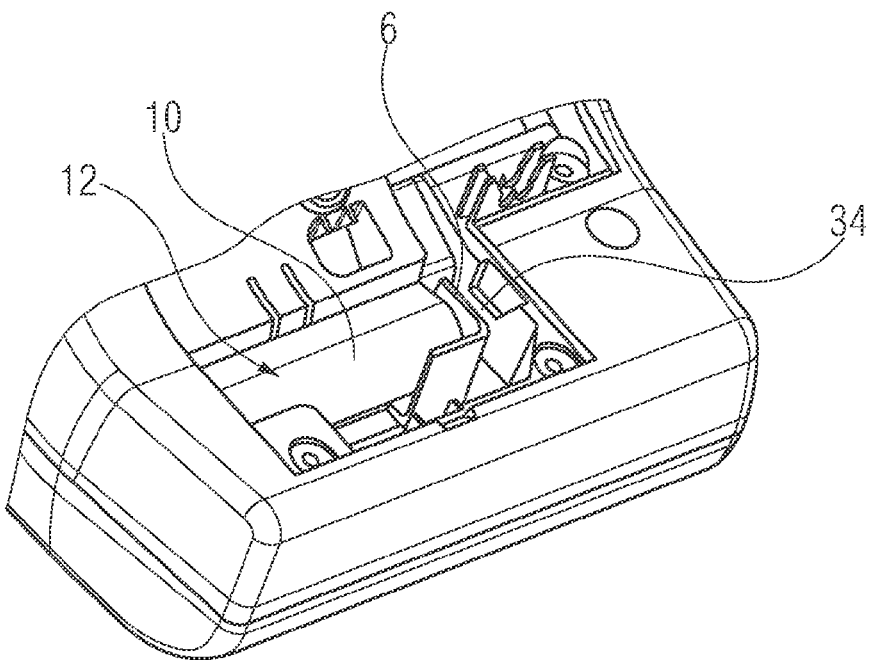
FIG. 3 is a detail of the vehicle data recording unit as per FIG. 1, with buffer battery, in a perspective view.

Also arranged within the housing 2 is a battery receptacle 4 for receiving a buffer battery 10 for the memory and control unit. The battery receptacle 4 has a battery compartment 12 delimited by a first stop 6 and by a second stop 8, the second stop 8 situated opposite the first stop 6, for holding a first buffer battery 10 (see FIG. 3) between the first stop 6 and the second stop 8.

Figure 4:
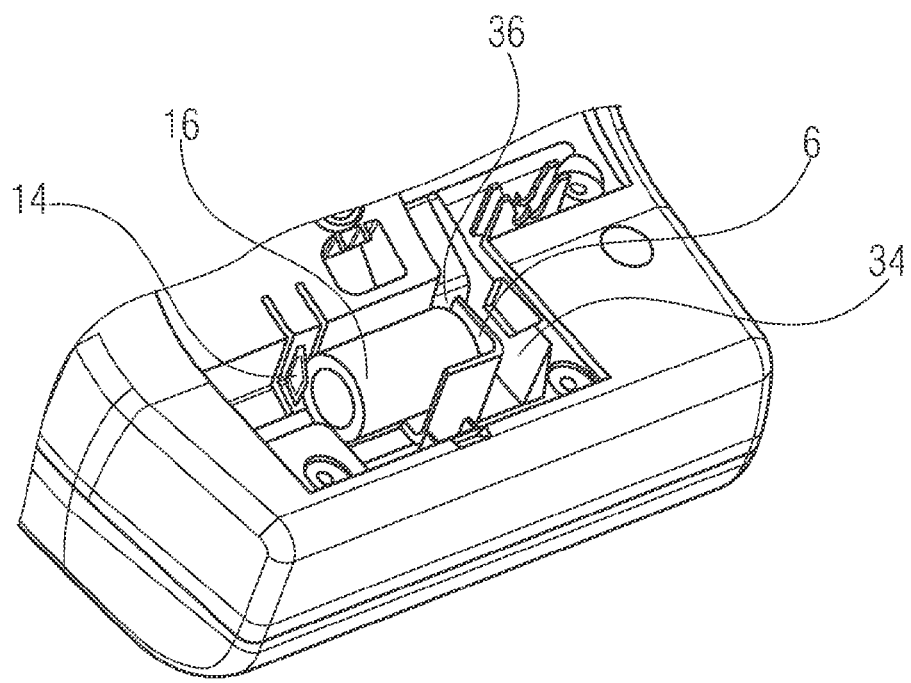
FIG. 4 is a detail of the vehicle data recording unit of FIG. 1, with a different buffer battery, in a perspective view.

Arranged between the first stop 6 and the second stop 8 of the battery receptacle 4 is a third stop 14 for holding a second buffer battery 16 (see FIG. 4), which has a shorter length than the first buffer battery 10, in the battery compartment 12 between the third stop 14 and the first stop 6. In this way, optionally the first, relatively long buffer battery 10 or the second, relatively short buffer battery 16 can be held in the battery compartment 12.

The third stop 14 is a resiliently elastic stop that projects into the battery compartment 12, wherein the third stop 14 can be pushed out of the battery compartment 12 counter to its spring force. In this exemplary embodiment, the spring elasticity is attained in that the third stop 14 has a leaf spring element 18 via which it is fastened to the battery receptacle 4. A first buffer battery 10 inserted into the battery compartment 12 pushes the third stop 14 out of the battery compartment 12, such that the battery compartment 12 is vacated by the third stop 14 in order that the relatively long buffer battery 10 can be received.

As can be seen from FIG. 2, the housing 2 has a housing opening 20 through which the battery compartment 12 is accessible from outside the housing 2. The housing opening 20 can be closed by a housing cover 22 that forms a part of the housing 2 (see FIG. 5).

The battery receptacle 4 has, on a side of the battery compartment 12 facing away from the housing opening 20, a spring element 24 (cf. FIGS. 1, 2), wherein the spring direction of the spring element 24 points towards the housing opening 20 and the housing cover 22. In this exemplary embodiment, the spring element 24 is a spring tongue connected to form a single component to a wall 26 of the battery compartment 12. The wall 26 of the battery compartment 12 is in this case the base of the battery compartment 12.

Figure 5:
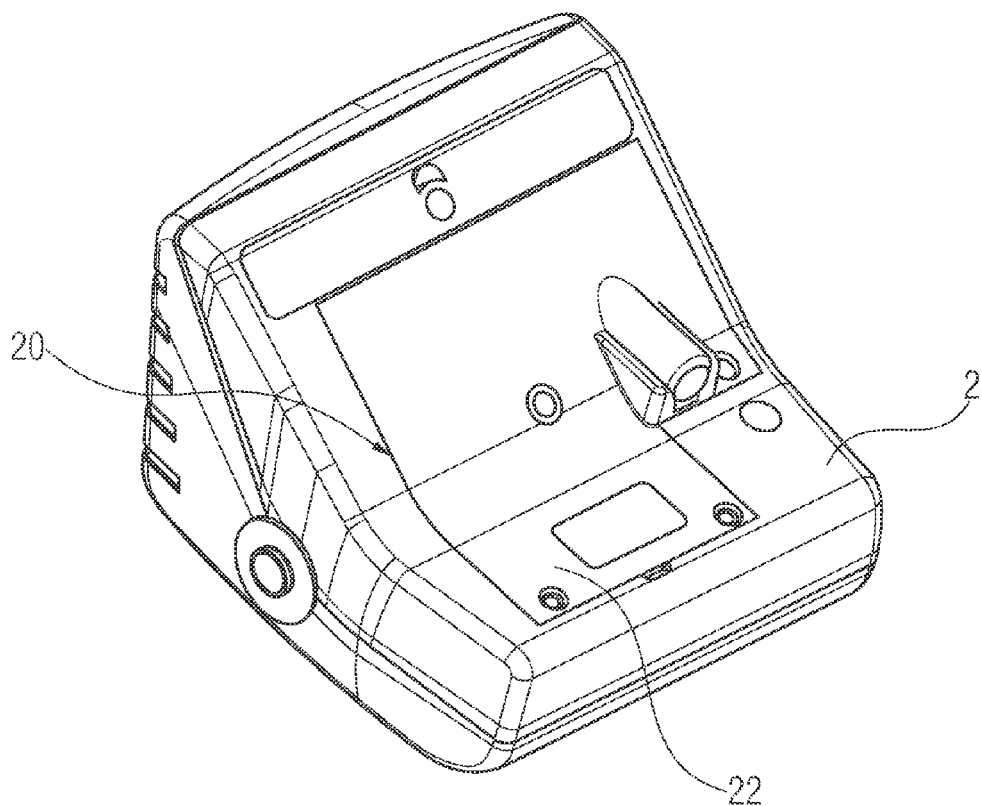
FIG. 5 is the vehicle data recording unit of FIG. 1, with a housing cover, in a perspective view from below.
Figure 6:
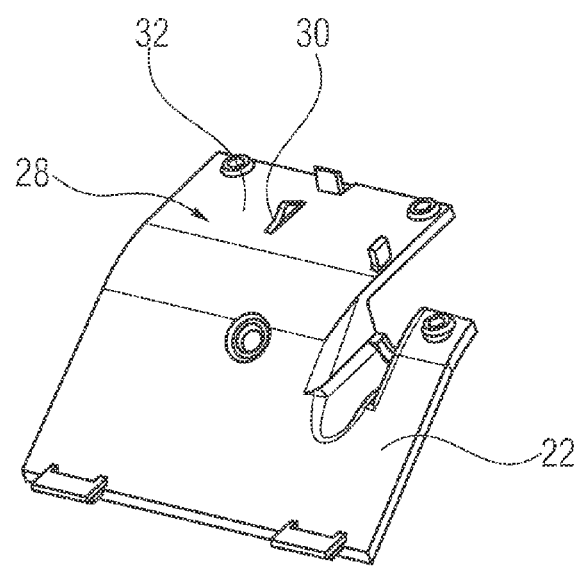
FIG. 6 is the housing cover from FIG. 5 in a perspective detail view.

In the state in which it is installed into the housing 2, the housing cover 22 has a supporting lug 30 that projects into the battery compartment 12 (see FIGS. 5, 6). For this purpose, the supporting lug 30 is provided on the housing cover 22, on the inner side 28 thereof which—when the housing cover 22 is in the installed state in the housing 2—faces toward the interior of the housing 2, in a cover region 32 adjoining the battery compartment 12. The supporting lug 30 corresponds to the third stop 14 and additionally supports a relatively short, second buffer battery 16.

It is also shown in FIGS. 1 to 4 that the battery receptacle 4 has a plug chamber 34 for a plug which serves for electrical connection of the first buffer battery 10 (see FIG. 3) or second buffer battery 16 (see FIG. 4) held in the battery compartment 12. The plug chamber 34 is in this exemplary embodiment is separated from the battery compartment 12 by the first stop 6. The first stop 6, which separates the plug chamber 34 from the battery compartment 12, has a recess 36 for the leadthrough of a plug cable (not illustrated here) of the first buffer battery 10 (see FIG. 3) or second buffer battery 16 (see FIG. 4). The battery receptacle 4 may for example be formed as a single-piece injection-molded plastics part together with the plug chamber 34, the first stop 6, the second stop 8, the third stop 14, and the spring element 24.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A vehicle data recording unit for installation in a motor vehicle, comprising:
    a housing;
    an electronic memory arranged in the housing;
    a control unit arranged in the housing;
    a battery receptacle arranged in the housing for receiving a buffer battery for the electronic memory and the control unit, the battery receptacle includes:
        a battery compartment delimited by a longitudinally extending wall, a first stop at a first longitudinal end of the longitudinally extending wall, and a second stop at a second longitudinal end of the longitudinally extending wall, the second stop situated opposite the first stop, the battery compartment configured for holding a first buffer battery having a first longitudinal length between the first stop and the second stop;
        a third stop of the battery receptacle that further delimits the battery compartment arranged between the first stop and the second stop and configured to hold a second buffer battery at a longitudinal end of the second buffer battery, the second buffer battery having a smaller longitudinal length than the first longitudinal length of the first buffer battery, the second buffer battery held between the first longitudinal stop and the third stop; and
        a floor that at least partially defines a depth of the battery compartment; and
    a cover arranged opposite the floor that forms a part of the housing and is configured to cover a housing opening,
    wherein the battery compartment is accessible from outside the housing through the housing opening, and
        wherein the third stop is a resiliently elastic stop that projects into the battery compartment through an aperture defined in the longitudinally extending wall, wherein the third stop is configured to be pushed out of the battery compartment counter to its spring force against the longitudinally extending wall of the battery receptacle,
    wherein one of the first buffer battery and the second buffer battery is held in the battery compartment.

2. The vehicle data recording unit as claimed in claim 1, further comprising:
    a spring element arranged in the battery receptacle between the first stop and the second stop on the floor of the battery compartment facing away from the housing opening,
    wherein a spring direction of the spring element is directed towards the housing opening.

3. The vehicle data recording unit as claimed in claim 2, wherein the spring element is a spring tongue connected to the floor of the battery compartment to form a single component.

4. The vehicle data recording unit as claimed in claim 1, wherein the cover has a supporting lug that projects into the battery compartment.

5. The vehicle data recording unit as claimed in claim 1, wherein the battery receptacle includes a plug chamber for a plug for electrical connection of the buffer battery held in the battery compartment,
    wherein the plug chamber is separated from the battery compartment by one of the first stop and by the second stop.

6. The vehicle data recording unit as claimed in claim 5, wherein the one of the first stop and the second stop that separates the plug chamber from the battery compartment has a recess for leadthrough of a plug cable.

7. The vehicle data recording unit as claimed in claim 1, wherein the battery receptacle is formed as a single-piece injection-molded plastic component with the first stop, the second stop, the third stop, the floor, and a spring element.

8. The vehicle data recording unit as claimed in claim 1, further comprising:
   a spring element arranged in the battery receptacle between the first stop and the second stop and on a side of the battery compartment facing away from the housing opening,
   wherein a spring direction of the spring element points towards the housing opening.

9. The vehicle data recording unit as claimed in claim 5, wherein the battery receptacle is formed as a single-piece injection-molded plastic component with the first stop, the second stop, the third stop, a spring element, and the plug chamber.

\* \* \* \* \*